(12) United States Patent
Einzinger et al.

(10) Patent No.: US 11,839,133 B2
(45) Date of Patent: Dec. 5, 2023

(54) ORGANIC PHOTODETECTORS FOR IN-CELL OPTICAL SENSING

(71) Applicant: Apple Inc., Cupertino, CA (US)

(72) Inventors: Markus Einzinger, Sunnyvale, CA (US); Martijn Kuik, Santa Clara, CA (US); Mohammad Yeke Yazdandoost, Santa Clara, CA (US); Niva A. Ran, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 299 days.

(21) Appl. No.: 17/200,683

(22) Filed: Mar. 12, 2021

(65) Prior Publication Data
US 2022/0293682 A1    Sep. 15, 2022

(51) Int. Cl.
*H01L 51/52* (2006.01)
*H10K 65/00* (2023.01)
*H10K 30/30* (2023.01)
*H10K 50/11* (2023.01)
*H10K 50/15* (2023.01)
*H10K 50/16* (2023.01)

(52) U.S. Cl.
CPC .............. *H10K 65/00* (2023.02); *H10K 30/30* (2023.02); *H10K 50/11* (2023.02); *H10K 50/15* (2023.02); *H10K 50/16* (2023.02)

(58) Field of Classification Search
CPC ........................................................ H10K 65/00
See application file for complete search history.

(56) References Cited

U.S. PATENT DOCUMENTS

| | | |
|---|---|---|
| 5,231,689 A | 7/1993 | Reidinger |
| 6,349,159 B1 | 2/2002 | Uebbing et al. |
| 6,529,661 B2 | 3/2003 | Kropp |
| 6,556,349 B2 | 4/2003 | Cox et al. |
| 6,586,776 B1 | 7/2003 | Liu |
| 6,910,812 B2 | 6/2005 | Pommer |
| 6,919,681 B2 | 7/2005 | Cok et al. |
| 6,946,647 B1 | 9/2005 | O'Neill et al. |

(Continued)

FOREIGN PATENT DOCUMENTS

| | | |
|---|---|---|
| CN | 105531653 | 4/2016 |
| CN | 107180853 | 9/2017 |

(Continued)

OTHER PUBLICATIONS

U.S. Appl. No. 17/466,813, filed Sep. 3, 2021, Vulis et al.
(Continued)

*Primary Examiner* — Benjamin P Sandvik
(74) *Attorney, Agent, or Firm* — Brownstein Hyatt Farber Schreck, LLP

(57) ABSTRACT

An organic light-emitting diode (OLED) display includes an array of OLED pixels and an array of organic photodetector (OPD) pixels. An OLED pixel in the array of OLED pixels includes an OLED hole transport layer (HTL), an OLED electron transport layer (ETL), and an emissive layer positioned between the OLED HTL and the OLED ETL. An OPD pixel in the array of OPD pixels includes the OLED HTL, the OLED ETL, and an electron donor material positioned between the OLED HTL and the OLED ETL, wherein the OLED ETL functions as an electron acceptor material for the OPD pixel. In other embodiments, the OPD pixel may be configured differently.

24 Claims, 11 Drawing Sheets

(56) References Cited

U.S. PATENT DOCUMENTS

| | | |
|---|---|---|
| 6,948,820 B2 | 9/2005 | Veligdan et al. |
| 7,021,833 B2 | 4/2006 | Loh |
| 7,444,083 B2 | 10/2008 | Ohashi et al. |
| 7,495,272 B2 | 2/2009 | Maruyama et al. |
| 7,499,094 B2 | 3/2009 | Kuriyama |
| 7,518,462 B2 | 4/2009 | Kanno et al. |
| 7,706,073 B2 | 4/2010 | Munro |
| RE41,673 E | 9/2010 | Ma |
| 7,842,246 B2 | 11/2010 | Wohlstadter et al. |
| 8,077,393 B2 | 12/2011 | Steenblik |
| 8,305,400 B2 | 11/2012 | Otani |
| 8,310,413 B2 | 11/2012 | Fish et al. |
| 8,603,642 B2 | 12/2013 | Hatwar et al. |
| 8,624,853 B2 | 1/2014 | Han et al. |
| 8,625,058 B2 | 1/2014 | Kozuma et al. |
| 8,664,655 B2 | 3/2014 | Lee et al. |
| 8,743,027 B2 | 6/2014 | Wu et al. |
| 8,749,528 B2 | 6/2014 | Imai et al. |
| 8,780,065 B2 | 7/2014 | Ribeiro et al. |
| 9,007,349 B2 | 4/2015 | Tseng |
| 9,064,451 B2 | 6/2015 | Lynch et al. |
| 9,070,648 B2 | 6/2015 | de Jong et al. |
| 9,112,043 B2 | 8/2015 | Arai |
| 9,183,779 B2 | 11/2015 | Soto |
| 9,342,181 B2 | 5/2016 | Wyatt et al. |
| 9,431,621 B2 | 8/2016 | Forrest et al. |
| 9,530,381 B1 | 12/2016 | Bozarth et al. |
| 9,570,002 B2 | 2/2017 | Sakariya et al. |
| 9,614,168 B2 | 4/2017 | Zhang et al. |
| 9,633,247 B2 | 4/2017 | Pope et al. |
| 9,741,286 B2 | 8/2017 | Sakariya et al. |
| 9,762,329 B2 | 9/2017 | Motohara |
| 9,836,165 B2 | 12/2017 | Nho et al. |
| 9,870,075 B2 | 1/2018 | Han et al. |
| 9,909,862 B2 | 3/2018 | Ansari et al. |
| 9,947,901 B2 | 4/2018 | Shedletsky et al. |
| 10,033,948 B2 | 7/2018 | Rephaeli et al. |
| 10,073,228 B2 | 9/2018 | Polleux et al. |
| 10,079,001 B2 | 9/2018 | Hodges |
| 10,090,574 B2 | 10/2018 | Wu |
| 10,115,000 B2 | 10/2018 | Mackey et al. |
| 10,222,475 B2 | 3/2019 | Pacala |
| 10,290,266 B2 | 5/2019 | Kurokawa |
| 10,331,939 B2 | 6/2019 | He et al. |
| 10,345,905 B2 | 7/2019 | McClure et al. |
| 10,410,036 B2 | 9/2019 | He et al. |
| 10,410,037 B2 | 9/2019 | He et al. |
| 10,410,039 B2 | 9/2019 | Ling et al. |
| 10,453,381 B2 | 10/2019 | Kurokawa |
| 10,474,286 B2 | 11/2019 | Bae et al. |
| 10,545,616 B2 | 1/2020 | Wang et al. |
| 10,551,662 B2 | 2/2020 | Kimura et al. |
| 10,565,734 B2 | 2/2020 | Bevensee et al. |
| 10,614,279 B2 | 4/2020 | Kim et al. |
| 10,629,664 B2 | 4/2020 | Lin et al. |
| 10,637,008 B2 | 4/2020 | Harada et al. |
| 10,664,680 B2 | 5/2020 | Xu et al. |
| 10,713,458 B2 | 7/2020 | Bhat et al. |
| 10,748,476 B2 | 8/2020 | Zhao et al. |
| 10,838,556 B2 | 11/2020 | Yeke Yazdandoost et al. |
| 10,840,320 B2 | 11/2020 | Yazdandoost et al. |
| 10,903,901 B2 | 1/2021 | Mitchell |
| 10,950,592 B2 | 3/2021 | Ding et al. |
| 10,976,416 B2 | 4/2021 | Park et al. |
| 10,978,523 B2 | 4/2021 | Park et al. |
| 10,989,846 B2 | 4/2021 | Hitomi et al. |
| 11,041,713 B2 | 6/2021 | Han et al. |
| 11,527,582 B1 | 12/2022 | Ran et al. |
| 2003/0148391 A1 | 8/2003 | Salafsky |
| 2004/0067324 A1 | 4/2004 | Lazarev et al. |
| 2004/0209116 A1 | 10/2004 | Ren et al. |
| 2005/0094931 A1 | 5/2005 | Yokoyama et al. |
| 2011/0176086 A1 | 7/2011 | Katoh et al. |
| 2012/0113357 A1 | 5/2012 | Cheng et al. |
| 2013/0113733 A1 | 5/2013 | Lim et al. |
| 2013/0240840 A1* | 9/2013 | Forrest .................. H10K 30/30 257/E51.026 |
| 2014/0044392 A1 | 2/2014 | Fattal et al. |
| 2015/0309385 A1 | 10/2015 | Shu et al. |
| 2017/0242506 A1 | 8/2017 | Patel et al. |
| 2017/0330920 A1* | 11/2017 | Tanaka ................... H10K 65/00 |
| 2018/0032778 A1 | 2/2018 | Lang |
| 2018/0102491 A1 | 4/2018 | Hou et al. |
| 2018/0323243 A1 | 11/2018 | Wang |
| 2019/0080138 A1 | 3/2019 | Gao et al. |
| 2019/0130155 A1 | 5/2019 | Park |
| 2019/0179488 A1 | 6/2019 | Klenkler et al. |
| 2019/0293849 A1 | 9/2019 | Du et al. |
| 2020/0051499 A1 | 2/2020 | Chung et al. |
| 2020/0174163 A1 | 6/2020 | Han et al. |
| 2020/0209729 A1 | 7/2020 | Chen et al. |
| 2020/0241138 A1 | 7/2020 | Allen et al. |
| 2020/0265206 A1 | 8/2020 | Chung et al. |
| 2020/0293741 A1 | 9/2020 | Du |
| 2020/0342194 A1 | 10/2020 | Bhat et al. |
| 2021/0005669 A1* | 1/2021 | Kamada ................. H10K 50/16 |
| 2021/0014429 A1 | 1/2021 | Alasirnio et al. |
| 2021/0050385 A1 | 2/2021 | Chuang et al. |
| 2021/0064159 A1 | 3/2021 | Yeke Yazdandoost et al. |
| 2021/0066669 A1* | 3/2021 | Kubota ................ H10K 50/865 |
| 2021/0089741 A1 | 3/2021 | Yeh et al. |
| 2021/0091342 A1 | 3/2021 | Chen et al. |
| 2021/0103075 A1 | 4/2021 | Park et al. |
| 2021/0158751 A1* | 5/2021 | Cha ....................... G06V 10/143 |
| 2021/0255668 A1 | 8/2021 | Xiang et al. |
| 2021/0287602 A1 | 9/2021 | Chen et al. |
| 2021/0396935 A1 | 12/2021 | Chen et al. |
| 2022/0035200 A1 | 2/2022 | Chen et al. |
| 2022/0067340 A1* | 3/2022 | Han ..................... H10K 50/865 |
| 2022/0158141 A1* | 5/2022 | Yuki ........................ H05B 33/12 |
| 2023/0034270 A1 | 2/2023 | Medower et al. |
| 2023/0070943 A1 | 3/2023 | Vulis et al. |
| 2023/0111407 A1 | 4/2023 | Ran et al. |

FOREIGN PATENT DOCUMENTS

| | | |
|---|---|---|
| CN | 107271404 | 10/2017 |
| CN | 107330426 | 11/2017 |
| CN | 107515435 | 12/2017 |
| CN | 108292361 | 7/2018 |
| CN | 108885693 | 11/2018 |
| CN | 109074475 | 12/2018 |
| CN | 109791325 | 5/2019 |
| CN | 109983471 | 7/2019 |
| CN | 110488315 | 11/2019 |
| DE | 202004002512 | 3/2005 |
| EP | 2463927 | 8/2013 |
| EP | 3171254 | 5/2017 |
| EP | 3404484 | 11/2018 |
| EP | 3438880 | 2/2019 |
| EP | 3576154 | 12/2019 |
| JP | H0642898 | 2/1994 |
| JP | 6127447 | 5/2017 |
| KR | 20050022260 | 3/2005 |
| WO | WO 10/029542 | 3/2010 |
| WO | WO 17/204777 | 11/2017 |
| WO | WO 18/093798 | 5/2018 |
| WO | WO 18/186580 | 10/2018 |
| WO | WO 18/210317 | 11/2018 |

OTHER PUBLICATIONS

Gelinck et al., "X-Ray Detector-on-Plastic With High Sensitivity Using Low Cost, Solution-Processed Organic Photodiodes," IEEE, 2015, pp. 1-8.

Garcia de Arquer et al., "Solution-processed semiconductors for next-generation photodetectors," *Nature Reviews—Materials*, 2017, vol. 2, No. 16100, pp. 1-16.

U.S. Appl. No. 16/791,905, filed Feb. 14, 2020, Xiang.

U.S. Appl. No. 16/815,875, filed Mar. 11, 2020, Chen et al.

U.S. Appl. No. 16/905,664, filed Jun. 18, 2020, Chen et al.

U.S. Appl. No. 16/945,643, filed Jul. 31, 2020, Chuang et al.

(56) References Cited

OTHER PUBLICATIONS

U.S. Appl. No. 16/945,174, filed Jul. 31, 2020, Chen et al.
U.S. Appl. No. 17/003,636, filed Aug. 26, 2020, Yeh et al.
U.S. Appl. No. 17/003,732, filed Aug. 26, 2020, Chen et al.
U.S. Appl. No. 17/006,708, filed Aug. 28, 2020, Ran et al.
U.S. Appl. No. 17/028,775, filed Sep. 22, 2020, Yeke Yazdandoost et al.
U.S. Appl. No. 17/865,169, filed Jul. 14, 2022, Medower et al.
U.S. Appl. No. 18/079,702, filed Dec. 12, 2022, Ran et al.
Invitation to Pay Additional Fees dated Jun. 14, 2022, PCT/US2022/017842, 16 pages.
International Search Report and Written Opinion dated Aug. 5, 2022, PCT/US2022/017842, 22 pages.
Byrnes et al., "Designing large, high-efficiency, high-numerical-aperture, transmissive meta-lenses for visible light," Optics Express, vol. 24, No. 5, Mar. 7, 2016, 15 pages.

* cited by examiner

ORGANIC PHOTODETECTORS FOR IN-CELL OPTICAL SENSING

FIELD

The described embodiments relate generally to electronic displays and, more particularly, to organic light-emitting diode (OLED) displays in which one or more organic photodetectors (e.g., organic photodiodes) are integrated for in-cell optical sensing.

BACKGROUND

In-cell optical sensing is the sensing of light using optical photodetectors (OPDs) that are integrated with a display. In-cell optical sensing may be used in various applications, such as biometric sensing (e.g., face, fingerprint, or retina sensing), OLED illumination sensing, touch sensing, ambient light sensing, or health sensing. OPDs may be configured to sense visible light, infrared light, or other ranges of electromagnetic radiation wavelengths.

SUMMARY

Embodiments of the systems, devices, methods, and apparatus described in the present disclosure are directed to in-cell optical sensing and, more particularly, to the integration of OPDs into an OLED display.

In a first aspect, the present disclosure describes an OLED display. The OLED display may include an array of OLED pixels and an array of OPD pixels. An OLED pixel in the array of OLED pixels may include an OLED hole transport layer (HTL), an OLED electron transport layer (ETL), and an emissive layer (EML) positioned between the OLED HTL and the OLED ETL. An OPD pixel in the array of OPD pixels may include the OLED HTL, the OLED ETL, and an electron donor material positioned between the OLED HTL and the OLED ETL. The OLED ETL may function as an electron acceptor material for the OPD pixel.

In another aspect, the present disclosure describes a display. The display may include an OLED pixel and an OPD pixel (and may include many of each). The OLED pixel may include an OLED HTL and an OLED ETL. The OPD pixel may include the OLED HTL, the OLED ETL, an electron donor material positioned between the OLED HTL and the OLED ETL, an electron acceptor material positioned between the OLED HTL and the OLED ETL, and an intermediate material. The electron acceptor material and the electron donor material may be positioned on a first side of the intermediate material, and the OLED ETL may be positioned on a second side of the intermediate material.

In another aspect of the disclosure, the present disclosure describes an OPD pixel. The OPD pixel may include an OLED HTL, an OLED ETL, an electron donor material positioned between the OLED HTL and the OLED ETL and including a p-dopant material, and an electron acceptor material positioned between the OLED HTL and the OLED ETL and including an n-dopant material. The electron donor material including the p-dopant material and the electron acceptor material including the n-dopant material may form a p-n junction.

In another aspect of the disclosure, the present disclosure describes an OPD pixel. The OPD pixel may include an OLED HTL, an OLED ETL, an electron donor material positioned between the OLED HTL and the OLED ETL, an electron acceptor material positioned between the OLED HTL and the OLED ETL, and a first interface between the electron acceptor material and the OLED ETL. The first interface may include an organic n-dopant material. In some embodiments, the OPD pixel may also include a second interface between the OLED HTL and the electron donor layer. The second interface may include an organic p-dopant material.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
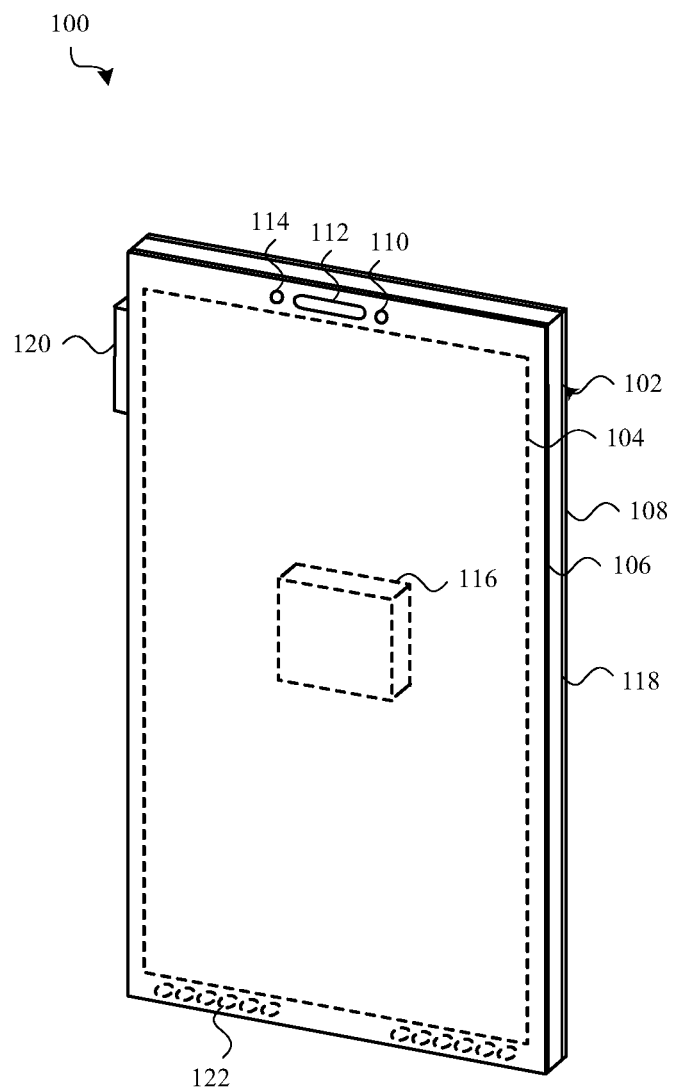
FIGS. 1A and 1B show an example of a device having an array of photodetectors integrated with a display.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

An OPD pixel, or an array of OPD pixels, may be integrated into an OLED display while forming the display (e.g., in parallel with forming OLED pixels). Alternatively, the OPD pixel(s) may be integrated into the display after the display is formed (e.g., after the OLED pixels are formed). While the latter may enable the OPD pixel(s) to be optimized largely independently of the OLED pixels, such optimization may at times conflict with optimizing the OLED pixels. Therefore, to preserve the integrity of a display as much as possible, the systems, devices, methods, and apparatus described herein include OPD pixels that are formed while forming an OLED display. The OPD pixels described herein may be formed such that they share the cathode, OLED HTL, or OLED ETL structures (e.g., materials and layers) used by OLED pixels. The OPD pixels may also share other structures used by OLED pixels, such as hole injection layer (HIL), hole blocking layer (HBL), electron injection layer (EIL), or electron blocking layer (EBL).

These and other aspects are described with reference to FIGS. 1A-10. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "beneath", "left", "right", etc. may be used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. Numerical terminology, such as "first", "second", "third", "fourth", etc. may be used to enumerate more than one instance of an element or component, but holds no other meaning. Thus, an element that is initially introduced as a "first" element with reference to one figure may be introduced as a "second" element with reference to another figure or a claim. The use of alternative terminology, such as "or", is intended to indicate different combinations of the alternative elements. For example, A or B is intended to include A, or B, or A and B.

Figure 1B:
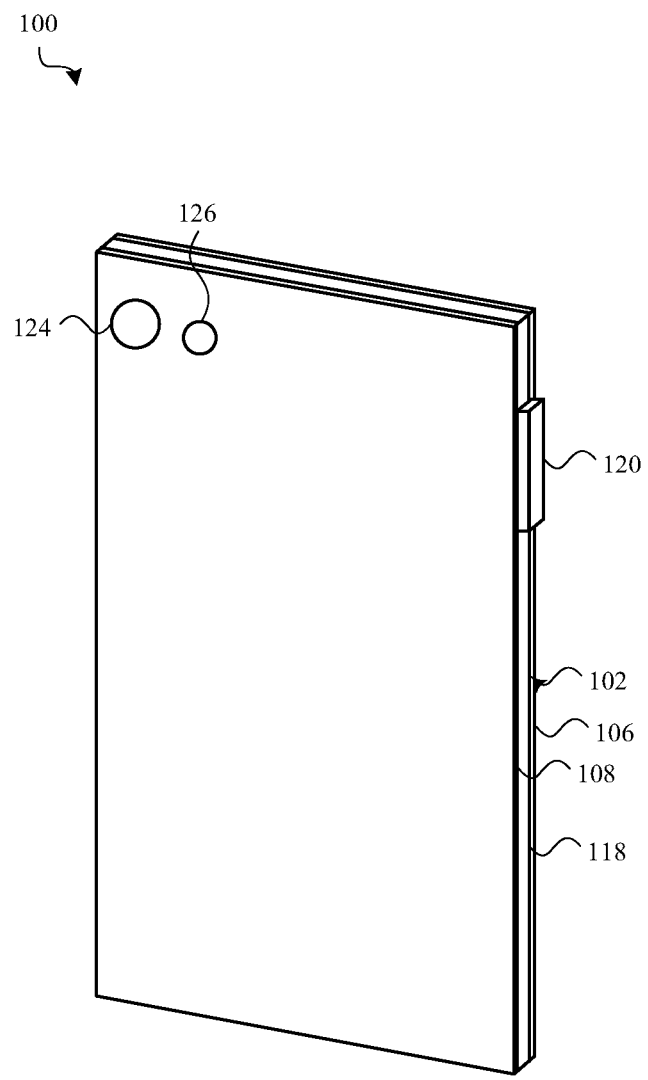

FIGS. 1A and 1B show an example of a device 100 having an array of photodetectors integrated with a display, such as an array of OPD pixels integrated with an array of OLED pixels. The device's dimensions and form factor, including the ratio of the length of its long sides to the length of its short sides, suggest that the device 100 is a mobile phone (e.g., a smartphone). However, the device's dimensions and form factor are arbitrarily chosen, and the device 100 could alternatively be any portable electronic device including, for example, a mobile phone, tablet computer, portable computer, portable music player, health monitor device, portable terminal, vehicle navigation system, robot navigation system, wearable device (e.g., a head-mounted display (HMD), glasses, watch, earphone or earbud, and so on), or other portable or mobile device. The device 100 could also be a device that is semi-permanently located (or installed) at a single location. FIG. 1A shows a front isometric view of the device 100, and FIG. 1B shows a rear isometric view of the device 100. The device 100 may include a housing 102 that at least partially surrounds a display 104. The housing 102 may include or support a front cover 106 and/or a rear cover 108. The front cover 106 may be positioned over the display 104, and may provide a window through which the display 104 may be viewed. In some embodiments, the display 104 may be attached to (or abut) the housing 102 and/or the front cover 106. In alternative embodiments of the device 100, the housing 102 and/or other components of the device 100 may have an alternative configuration.

The display 104 may include one or more light-emitting elements and may be configured, for example, as an organic light-emitting diode (OLED) display. In some embodiments, the display 104 or front cover 106 may include, or be associated with, one or more touch and/or force sensors that are configured to detect a touch and/or a force applied to a surface of the front cover 106.

The various components of the housing 102 may be formed from the same or different materials. For example, the sidewall 118 may be formed using one or more metals (e.g., stainless steel), polymers (e.g., plastics), ceramics, or composites (e.g., carbon fiber). In some cases, the sidewall 118 may be a multi-segment sidewall including a set of antennas. The antennas may form structural components of the sidewall 118. The antennas may be structurally coupled (to one another or to other components) and electrically isolated (from each other or from other components) by one or more non-conductive segments of the sidewall 118. The front cover 106 may be formed, for example, using one or more of glass, a crystal (e.g., sapphire), or a transparent polymer (e.g., plastic) that enables a user to view the display 104 through the front cover 106. In some cases, a portion of the front cover 106 (e.g., a perimeter portion of the front cover 106) may be coated with an opaque ink to obscure components included within the housing 102. The rear cover 108 may be formed using the same material(s) that are used to form the sidewall 118 or the front cover 106. In some cases, the rear cover 108 may be part of a monolithic element that also forms the sidewall 118 (or in cases where the sidewall 118 is a multi-segment sidewall, those portions of the sidewall 118 that are non-conductive). In still other embodiments, all of the exterior components of the housing 102 may be formed from a transparent material, and components within the device 100 may or may not be obscured by an opaque ink or opaque structure within the housing 102.

The front cover 106 may be mounted to the sidewall 118 to cover an opening defined by the sidewall 118 (i.e., an opening into an interior volume in which various electronic components of the device 100, including the display 104, may be positioned). The front cover 106 may be mounted to the sidewall 118 using fasteners, adhesives, seals, gaskets, or other components.

A display stack or device stack (hereafter referred to as a "stack") including the display 104 may be attached (or abutted) to an interior surface of the front cover 106 and extend into the interior volume of the device 100. In some cases, the stack may include a touch sensor (e.g., a grid of capacitive, resistive, strain-based, ultrasonic, or other types of touch sensing elements), or other layers of optical, mechanical, electrical, or other types of components. In some cases, the touch sensor (or part of a touch sensor system) may be configured to detect a touch applied to an outer surface of the front cover 106 (e.g., to a display surface of the device 100).

In some cases, a force sensor (or part of a force sensor system) may be positioned within the interior volume below and/or to the side of the display 104 (and in some cases within the device stack). The force sensor (or force sensor system) may be triggered in response to the touch sensor detecting one or more touches on the front cover 106 (or a location or locations of one or more touches on the front cover 106), and may determine an amount of force associated with each touch, or an amount of force associated with the collection of touches as a whole. Alternatively, the force sensor (or force sensor system) may trigger operation of the touch sensor (or touch sensor system) in response to detecting a force on the front cover 106. In some cases, the force sensor (or force sensor system) may be used to determine the locations of touches on the front cover 106, and may thereby function as a touch sensor (or touch sensor system).

As shown primarily in FIG. 1A, the device 100 may include various other components. For example, the front of the device 100 may include one or more front-facing cameras 110, speakers 112, microphones, or other components 114 (e.g., audio, imaging, and/or sensing components) that are configured to transmit or receive signals to/from the device 100. In some cases, a front-facing camera 110, alone or in combination with other sensors, may be configured to operate as a bio-authentication or facial recognition sensor. The device 100 may also include various input and/or output devices 116 that are accessible from the front surface (or display surface) of the device 100. In some cases, the front-facing camera 110, I/O devices 116, and/or other sensors of the device 100 may be integrated with a display stack of the display 104 and moved under the display 104. For example, an array of OPD pixels may be interspersed with, or positioned around, an array of OLED pixels included in the display 104. The OPD pixels may be used as a camera (e.g., a visible light camera and/or an infrared camera) capable of acquiring an image of one or more of an environment of the device 100, an image of a user (e.g., the user's face, finger, or retina), an image of dust or dirt that is on or near the front cover 106, a depth map of objects within a field of view, indicia on an internal or external surface of the front cover 106, a scattered or reflected portion of light emitted by the display or a separate set of one or more light emitters, and so on.

The device 100 may also include buttons or other input devices positioned along the sidewall 118 and/or on a rear surface of the device 100. For example, a volume button or multipurpose button 120 may be positioned along the sidewall 118, and in some cases may extend through an aperture in the sidewall 118. The sidewall 118 may include one or more ports 122 that allow air, but not liquids, to flow into and out of the device 100. In some embodiments, one or more sensors may be positioned in or near the port(s) 122. For example, an ambient pressure sensor, ambient temperature sensor, internal/external differential pressure sensor, gas sensor, particulate matter sensor, or air quality sensor may be positioned in or near a port 122.

In some embodiments, the rear surface of the device 100 may include a rear-facing camera 124 or other optical sensor (see FIG. 1B). A flash or light source 126 may also be positioned along the rear of the device 100 (e.g., near the rear-facing camera). In some cases, the rear surface of the device 100 may include multiple rear-facing cameras.

The camera(s), microphone(s), pressure sensor(s), temperature sensor(s), biometric sensor(s), button(s), proximity sensor(s), touch sensor(s), force sensor(s), particulate matter or air quality sensor(s), and so on of the device 100 may form parts of various sensor systems.

Figure 2:
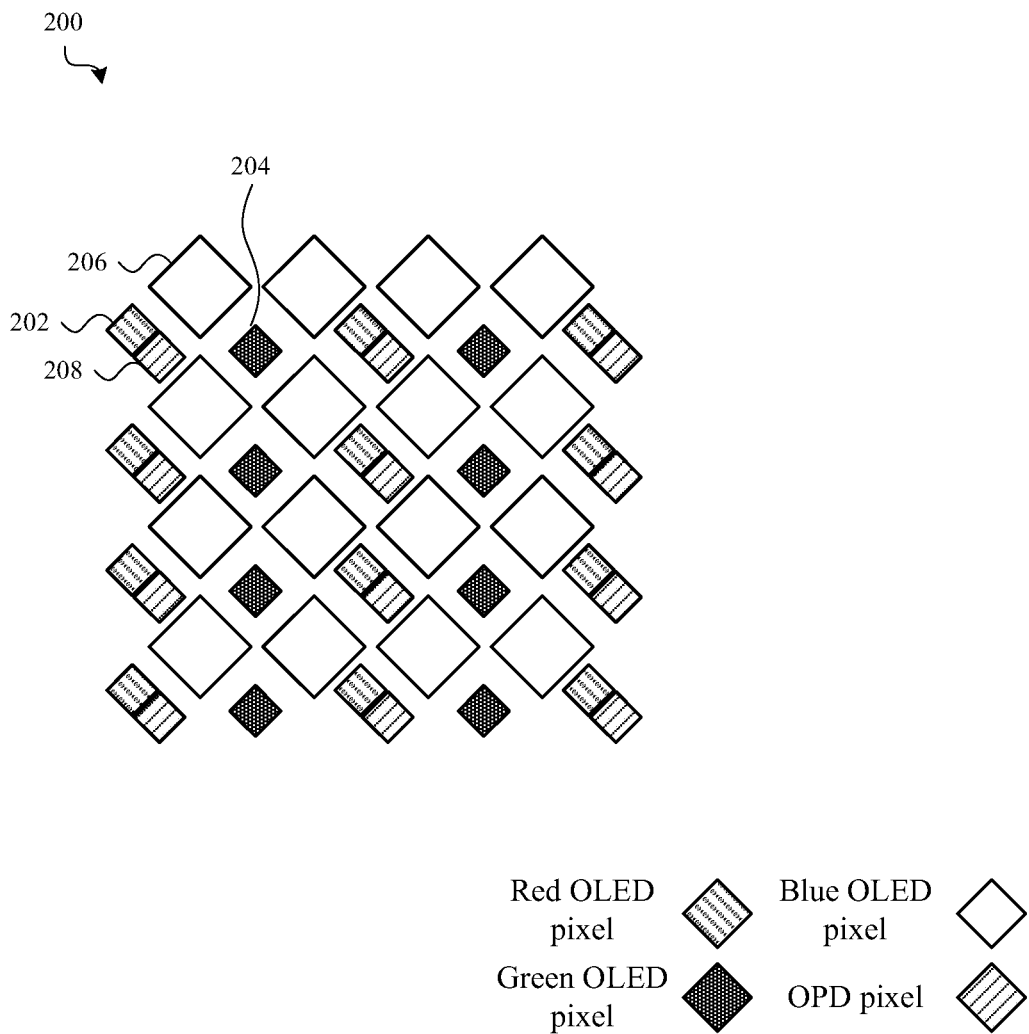
FIG. 2 shows an example plan view of a portion of an OLED display.

FIG. 2 shows an example plan view of a portion of an OLED display 200, which display 200 is one example of the display described with reference to FIGS. 1A-1B. The display 200 includes an array of OLED pixels 202, 204, 206 and an array of OPD pixels 208. By way of example, the OPD pixels 208 are interspersed with the OLED pixels 202, 204, 206. In other embodiments, the OPD pixels 208 may be positioned around a periphery of the OLED pixels 202, 204, 206, or grouped together in (or concentrated in greater numbers in) one or more particular regions of the array of OLED pixels 202, 204, 206.

The OLED pixels 202, 204, 206 may include red OLED pixels 202, green OLED pixels 204, and blue OLED pixels 206, or OLED pixels defining other color acquisition schemes. Although the OLED pixels 202, 204, 206 and OPD pixels 208 appear in the display 200 in equal numbers, the OLED pixels 202, 204, 206 and OPD pixels 208 may have equal or different densities by number and equal or different densities by area. In some embodiments, the OLED pixels 202, 204, 206 and OPD pixels 208 may be arranged in accordance with a Bayer color filter pattern, with an OPD pixel 208 replacing one of the green pixels in some or all instances of the Bayer pattern.

Figure 3:
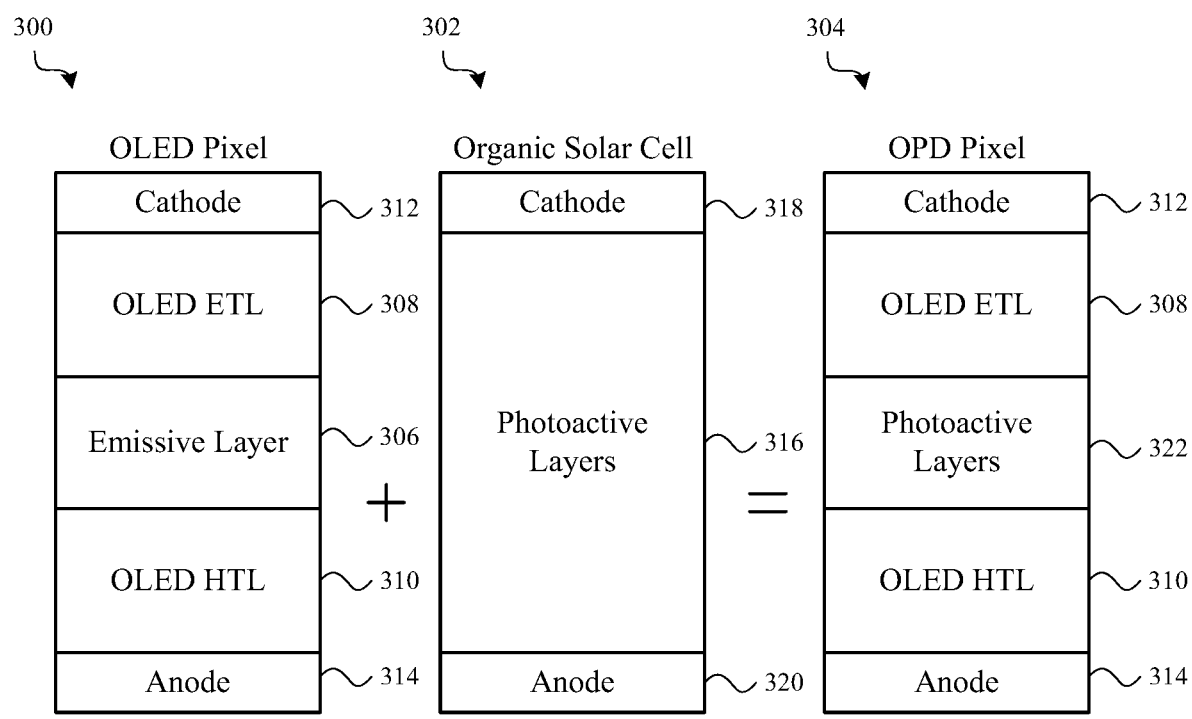
FIG. 3 shows examples of an OLED pixel, an organic solar cell, and an OPD pixel.

FIG. 3 shows examples of an OLED pixel 300, an organic solar cell 302, and an OPD pixel 304. The OLED pixel 300 is an example of the OLED pixels described with reference to FIGS. 1A-1B and 2. The OPD pixel 304 is an example of the OPD pixels described with reference to FIGS. 1A-1B and 2.

As shown, the OLED pixel 300 may include an emissive layer (EML) 306. The emissive layer 306 may have a first surface (or upper surface) bounded by an OLED ETL 308, and a second surface (or lower surface) bounded by an OLED HTL 310 (i.e., the emissive layer 306 may be positioned between the OLED ETL 308 and the OLED HTL 310). A cathode 312 may be disposed adjacent a surface of the OLED ETL 308, on a side of the OLED ETL 308 opposite a side of the OLED ETL 308 on which the emissive layer 306 is positioned. An anode 314 may be disposed adjacent a surface of the OLED HTL 310, on a side of the OLED HTL 310 opposite a side of the OLED ETL 308 on which the emissive layer 306 is positioned. The cathode 312, OLED ETL 308, emissive layer 306, OLED HTL 310, and anode 314, alone or in combination with other materials or layers, form an OLED stack. In some cases, and by way of example, the other materials may include a patterned prime layer, disposed between the OLED HTL 310 and the emissive layer 306.

In some cases, the composition of the emissive layer 306 may differ for red, blue, green, or other-colored pixels. In other cases, the composition of the emissive layer 306 may be the same for red, blue, green, and other-colored pixels, and the ranges of wavelengths to which different OLED pixels respond may be controlled by different color filters positioned on or over the light-receiving side of the OLED pixel.

In some cases, an OLED display may be formed by depositing an anode layer (including the anode 314) on a substrate (e.g., on an epitaxial stack including pixel circuitry), and then successively depositing the OLED HTL 310, the emissive layer 306, the OLED ETL 308, and the cathode 312 as additional layers. Some of these layers may be patterned and etched to define OLED pixels.

The organic solar cell 302 may include a set of photoactive materials (or layers) 316 capable of absorbing light within a range of electromagnetic radiation wavelengths. A cathode 318 may be disposed on one side of the set of photoactive materials 316, and an anode 320 may be disposed on the other side of the set of photoactive materials 316 (i.e., the cathode 318 and anode 320 may be disposed on opposite sides of the set of photoactive layers 316).

The organic solar cell 302 may be integrated into an array of the OLED pixels 300 (e.g., into an OLED display) in various ways. In some cases, it may be advantageous (e.g., cheaper, less disruptive to the OLED display, and so on) to preserve as many layers of the OLED pixel structure as possible. To this end, the OPD pixel 304 integrates the organic solar cell 302 into the OLED pixel 300 by replacing the emissive layer 306 (and possibly other layers, such as layers patterned for OLED operation (e.g., a prime layer)) with a set of photoactive layers 322, and retaining the layers of the OLED pixel 300 that define the anode 314, the OLED HTL 310, the OLED ETL 308, and the cathode 312.

In alternative embodiments of what is shown in FIG. 3 (and in all of the OPD pixel embodiments described herein), the OLED ETL 308 may be replaced by an OLED ETL in combination with one or more of an OLED EIL, an OLED EBL, or other layers. Similarly, the OLED HTL 310 may be replaced by an OLED HTL in combination with one or more of an OLED HIL, an OLED HBL, or other layers.

Figure 4:
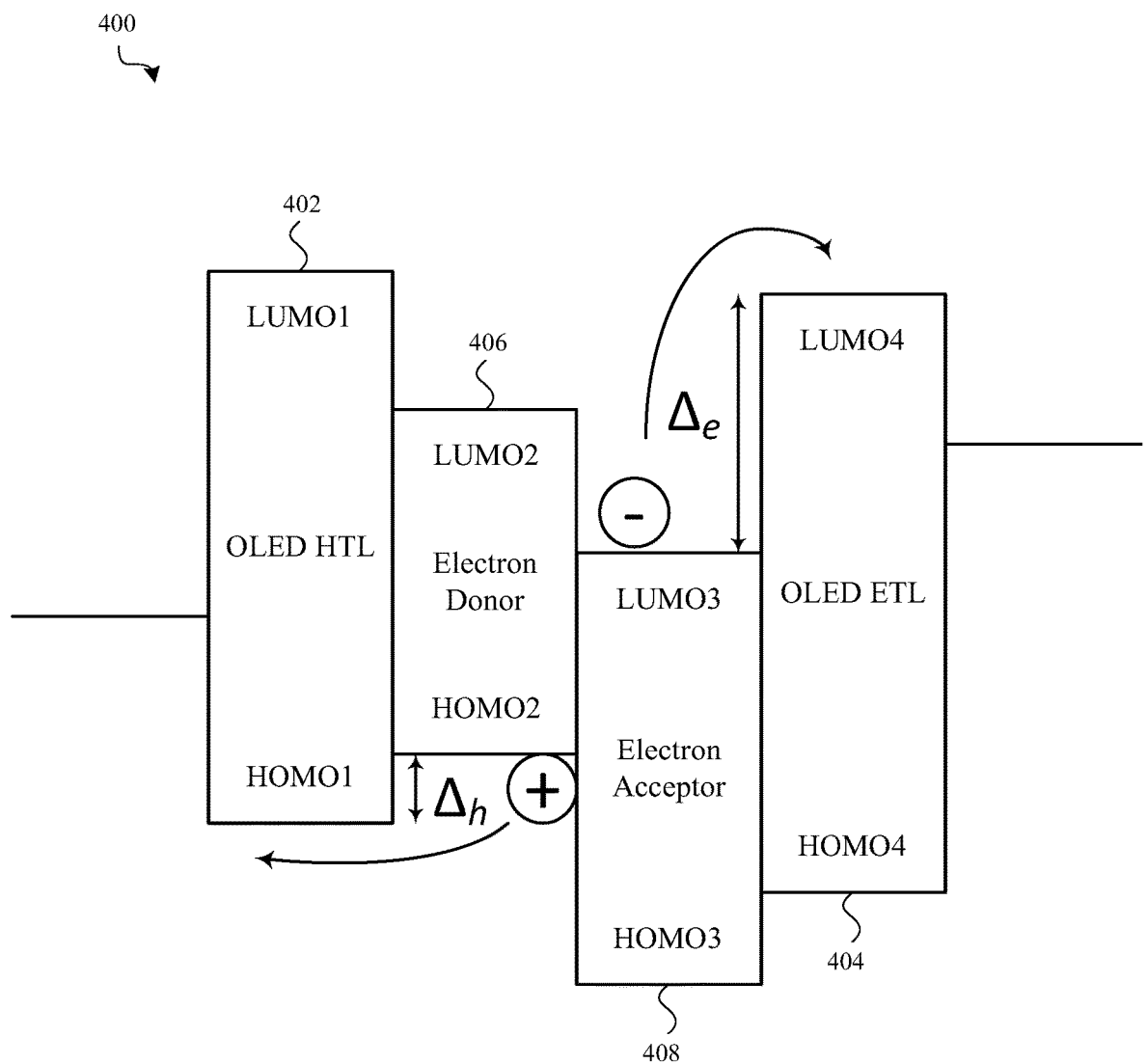
FIG. 4 shows a first example embodiment of an OPD pixel.

FIG. 4 shows a first example embodiment of an OPD pixel 400. In some cases, the OPD pixel 400 may be included in the display 104 described with reference to FIGS. 1A-1B, or in the array of OPD pixels described with reference to FIG. 2. The OPD pixel 400 may also be the OPD pixel described with reference to FIG. 3.

The OPD pixel 400 includes an OLED HTL 402, an OLED ETL 404, an electron donor material (or electron donor layer) 406, and an electron acceptor material (or electron acceptor layer) 408. The electron donor material 406 and the electron acceptor material 408 may be stacked with the OLED HTL 402 and the OLED ETL 404, with both the electron donor material 406 and the electron acceptor material 408 positioned between the OLED HTL 402 and the OLED ETL 404, and with the electron acceptor material 408 positioned between the electron donor material 406 and the OLED ETL 404. Alternatively, the electron donor material 406 and the electron acceptor material 408 may be mixed together in a random or intentional way to form a bulk heterojunction. The electron donor material 406 and the electron acceptor material 408 are an example of the photoactive layers described with reference to FIG. 3.

Examples of the electron donor material 406 include acenes, acene derivatives, or phtalocyanine derivatives. Examples of the electron acceptor material 408 include fullerenes, fullerene derivatives, rylene diimides, or rylene diimide derivatives.

As shown, each of the OLED HTL 402, the electron donor material 406, the electron acceptor material 408, and the OLED ETL 404 has a lowest unoccupied molecular orbital (LUMO) energy (a conduction band energy) and a highest occupied molecular orbital (HOMO) energy (a valence band energy). Combining the photoactive materials (or layers) of a solar cell with the OLED HTL 402 and the OLED ETL 404 of an OLED display results in energetic barriers between the LUMO energies and/or HOMO energies of adjacent materials/layers. In particular, combining the photoactive materials of a solar cell with the OLED HTL 402 and the OLED ETL 404 of an OLED display results in 1) a hole barrier ($\Delta_h$) between the HOMO energy of the electron donor material 406 (HOMO2) and the HOMO energy of the OLED HTL 402 (HOMO1), where $\Delta_h=|HOMO2-HOMO1|$, and 2) an electron barrier ($\Delta_e$) between the LUMO energy of the electron acceptor material 408 (LUMO3) and the LUMO energy of the OLED ETL 404 (LUMO4), where $\Delta_e=|LUMO3-LUMO4|$. Positive charges (holes) may have difficulty crossing the hole barrier, and negative charges (electrons) may have difficulty crossing the electron barrier.

The hole barrier ($\Delta_h$) and the electron barrier ($\Delta_e$) can cause inefficient charge extraction from the OPD pixel 400. Inefficient charge extraction leads to disadvantages such as low device efficiency, insufficient maximum achievable currents, and a low signal-to-noise ratio (SNR). Although the hole barrier and electron barrier shown in FIG. 4 could be altered by changing the construction (e.g., materials or doping) of the OLED HTL 402 or OLED ETL 404, this tends to reduce the efficiency of the OLED pixels that rely on the OLED HTL 402 and OLED ETL 404. FIGS. 5-9 show various alternative configurations of the photoactive materials (or layers), which alternative configurations can reduce the hole barrier and/or electron barrier shown for the OPD pixel 400.

Figure 5:
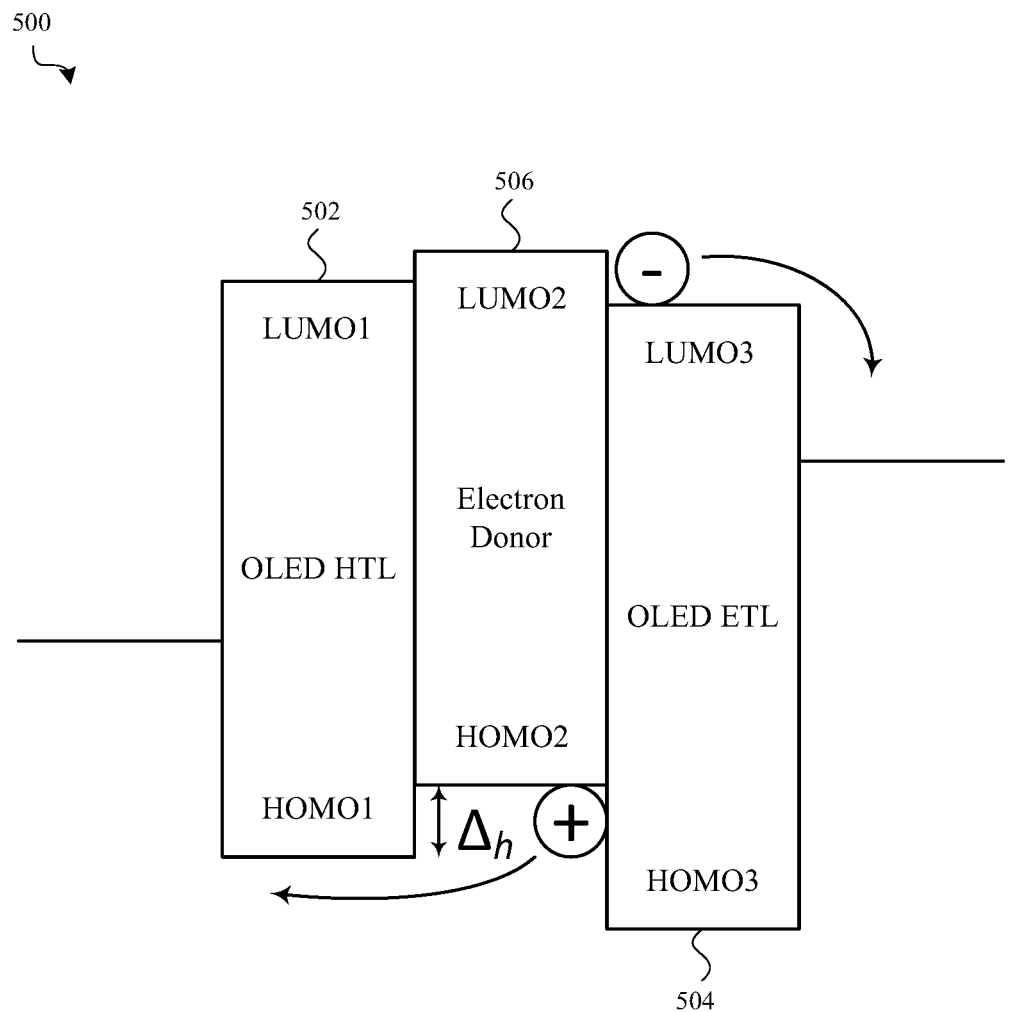
FIG. 5 shows a second example embodiment of an OPD pixel.

FIG. 5 shows a second example embodiment of an OPD pixel 500. In some cases, the OPD pixel 500 may be included in the display 104 described with reference to FIGS. 1A-1B, or in the array of OPD pixels described with reference to FIG. 2. The OPD pixel 500 may also be the OPD pixel described with reference to FIG. 3.

The OPD pixel 500 differs from the OPD pixel described with reference to FIG. 4 in that the OLED ETL 504 additionally functions as the electron acceptor material for the OPD pixel 500. That is, a layer that already exists in an OLED stack is used as the electron acceptor material for the OPD pixel 500.

The OPD pixel 500 includes an OLED HTL 502, an OLED ETL 504, and an electron donor material (e.g., an electron donor layer) 506. The electron donor material 506 may be stacked with the OLED HTL 502 and the OLED ETL 504, with the electron donor material 506 positioned between the OLED HTL 502 and the OLED ETL 504. Examples of the electron donor material 506 include acenes, acene derivatives, or phtalocyanine derivatives.

By removing the electron acceptor material described with reference to FIG. 4, the electron barrier ($\Delta_e$) described with reference to FIG. 4, between the electron acceptor material and the OLED ETL, is removed. In alternative embodiments, the electron barrier may be reduced but not removed.

To remove the electron barrier ($\Delta_e$) described with reference to FIG. 4, the LUMO energy of the electron donor material 506 (LUMO2) should be energetically shallower than the LUMO energy of the OLED ETL 504 (LUMO3). In some cases, the LUMO energy of the electron donor material 506 (LUMO2) may also be energetically shallower than the LUMO energy of the OLED HTL 502 (LUMO1). The HOMO energy of the electron donor material 506 (HOMO2) may be energetically shallower than the HOMO energy of the OLED ETL 504 (HOMO3), to prevent back-transfer and recombination of electron/hole pairs. The HOMO energy of the electron donor material 506 (HOMO2) may be energetically shallower than, and in some cases approximately equal to, the HOMO energy of the OLED HTL 502 (HOMO1), to provide a small hole barrier ($\Delta_h$). In the context of FIG. 5, approximately equal HOMO energies are defined as HOMO energies less than or equal to 0.3 electron Volts (eV). The relationships between the LUMO and HOMO energies of different materials may be tuned through the choice of electron donor material 506.

The oscillator strength of the electron donor material 506 should be high, to ensure high absorption of electromagnetic radiation within a spectral region of interest (in contrast to the oscillator strength of the OLED ETL 504, which is typically low). A high oscillator strength is defined herein as greater than 0.1, and may be provided by a material that strongly interacts with light, and a low oscillator strength is defined herein as lower than 0.1, and may be provided by a material that poorly interacts with light. The absorption of the electron donor material 506 may be well-matched to a spectral region of interest. For example, an OPD pixel configured to detect electromagnetic radiation in the visible part of the electromagnetic radiation spectrum should have an absorption band including, or including and limited to, the visible part of the electromagnetic radiation spectrum.

Figure 6:
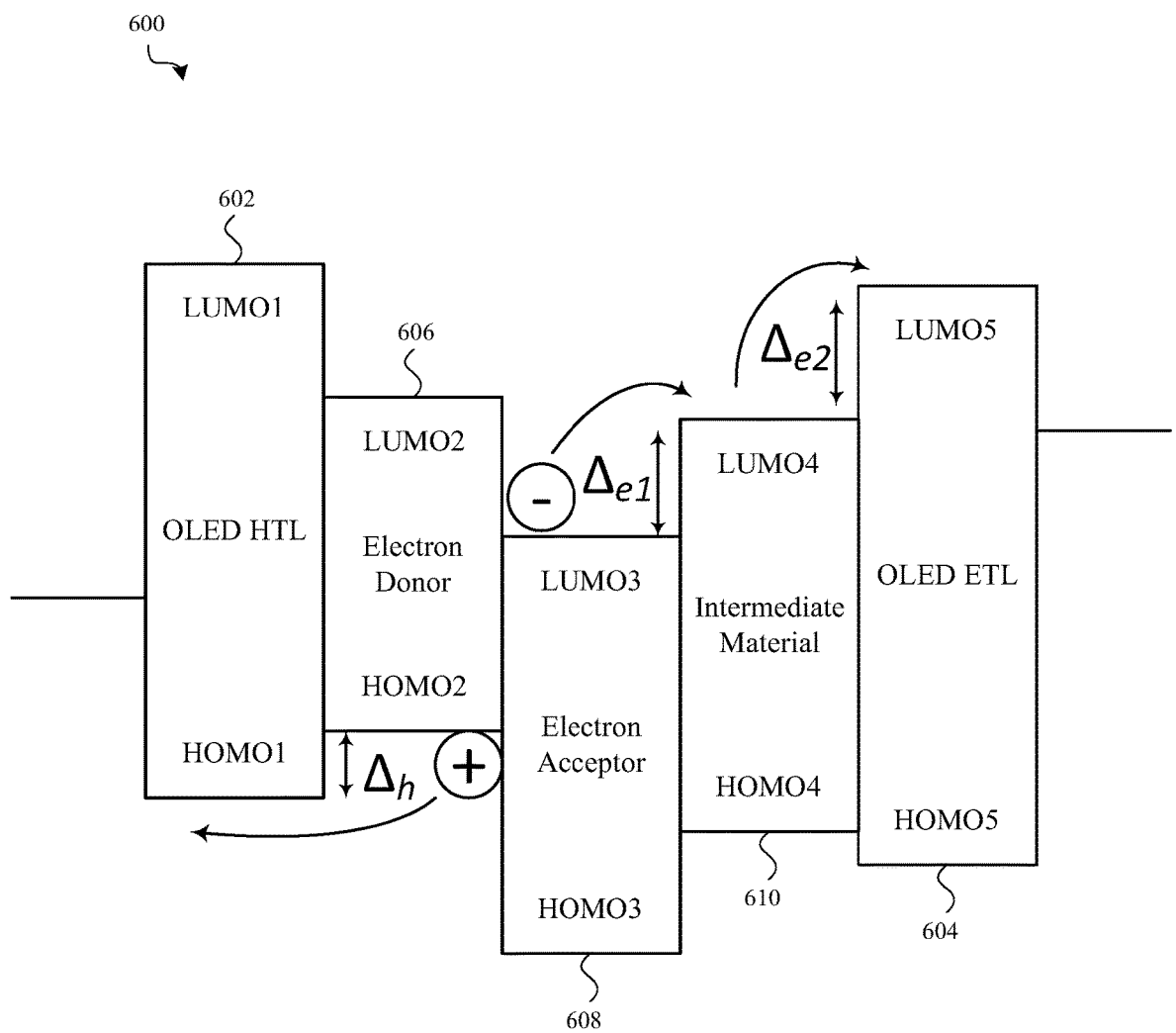
FIG. 6 shows a third example embodiment of an OPD pixel.

FIG. 6 shows a third example embodiment of an OPD pixel 600. In some cases, the OPD pixel 600 may be included in the display 104 described with reference to FIGS. 1A-1B, or in the array of OPD pixels described with reference to FIG. 2. The OPD pixel 600 may also be the OPD pixel described with reference to FIG. 3.

The OPD pixel 600 differs from the OPD pixel described with reference to FIG. 4 in that it includes an energetic staircase for charge extraction. That is, an additional one or more materials (e.g., layers of material) are added to the OPD pixel 600, between an electron acceptor material 608 and the OLED ETL 604. The additional material(s) subdivide an aggregate electron barrier between the electron acceptor material 608 and the OLED ETL 604 into a set of smaller electron barriers. Due to the exponential dependence of cross-barrier tunneling probability on energy level barrier height, overcoming two or more smaller electron barriers (e.g., $\Delta_{e1}$ and $\Delta_{e2}$) is easier than overcoming a single larger electron barrier of equal magnitude (e.g., $\Delta_e$, where $\Delta_e=\Delta_{e1}+\Delta_{e2}$).

The OPD pixel 600 includes an OLED HTL 602, an OLED ETL 604, an electron donor material (or electron donor layer) 606, an electron acceptor material (or electron acceptor layer) 608, and one or more intermediate materials (shown as one intermediate material 610 in the OPD pixel 600). The electron donor material 606 and the electron acceptor material 608 may be stacked with the OLED HTL 602 and the OLED ETL 604, with both the electron donor material 606 and the electron acceptor material 608 positioned between the OLED HTL 602 and the OLED ETL 604, and with the electron acceptor material 608 positioned between the electron donor material 606 and the OLED ETL 604 (e.g., in a stacked configuration). Alternatively, the electron donor material 606 and the electron acceptor material 608 may be mixed together in a random or intentional way to form a bulk heterojunction. The intermediate material (or layer) 610 may be positioned between the electron acceptor material 608 and the OLED ETL 604 (or between the heterojunction and the OLED ETL 604), with the electron donor material 606 and the electron acceptor material 608 positioned on a first side of the intermediate material 610, and the OLED ETL 604 positioned on a second side of the intermediate material 610. In cases where a second or additional intermediate materials are provided, the additional intermediate materials may be positioned between the intermediate material 610 and the OLED ETL 604.

Examples of the electron donor material 606 include acenes, acene derivatives, or phtalocyanine derivatives. Examples of the electron acceptor material 608 include fullerenes, fullerene derivatives, rylene diimides, or rylene diimide derivatives. Examples of the intermediate material 610 include tri-aryl amine derivatives.

By introducing one or more intermediate materials (e.g., the intermediate material 610) between the electron acceptor material 608 and the OLED ETL 604, to form an energetic staircase between the electron acceptor material 608 and the OLED ETL 604, the electron barrier ($\Delta_e$) described with reference to FIG. 4 is subdivided into a set of smaller electron barriers (e.g., $\Delta_{e1}$, $\Delta_{e2}$) In alternative embodiments, additional intermediate materials (e.g., a second intermediate material) may be introduced, and additional and smaller electron barriers may be formed. Different intermediate materials, when provided, may include different materials.

To establish an energetic staircase, the LUMO energy of the intermediate material 610 (LUMO4) should be energetically deeper than the LUMO energy of the electron acceptor material 608 (LUMO3), and energetically shallower than the LUMO energy of the OLED ETL 604 (LUMO5). In the case of more than one intermediate material, the intermediate material(s) may all have LUMO energies between the LUMO energy of the electron acceptor material 608 and the LUMO energy of the OLED ETL 604. The HOMO energy of the intermediate material 610 need not have any particular relationship with the HOMO energy of the electron acceptor material 608 or the OLED ETL 604. The HOMO energy of the electron donor material 606 (HOMO2) may be energetically shallower than, and in some cases approximately equal to, the HOMO energy of the OLED HTL 602 (HOMO1), to provide a small hole barrier (4). In the context of FIG. 6, approximately equal HOMO energies are defined as HOMO energies less than or equal to 0.3 electron Volts (eV). The relationships between the LUMO and HOMO energies of different materials may be tuned through the choice of electron donor material 606, electron acceptor material 608, and intermediate material(s) 610.

Because the dielectric constant of organic materials is very low (e.g., 2 or 3), charge transfer within the OPD pixel 600 may occur by means of a tunneling effect. For example, an electron may tunnel from LUMO3 to LUMO4, and then from LUMO4 to LUMO5, if the electron barriers between adjacent materials are not too large.

The oscillator strength of the intermediate material(s) 610 can be low, since the electron donor material 606 and the electron acceptor material 608 are responsible for the efficient absorption of electromagnetic radiation in a spectral region of interest.

Figure 7:
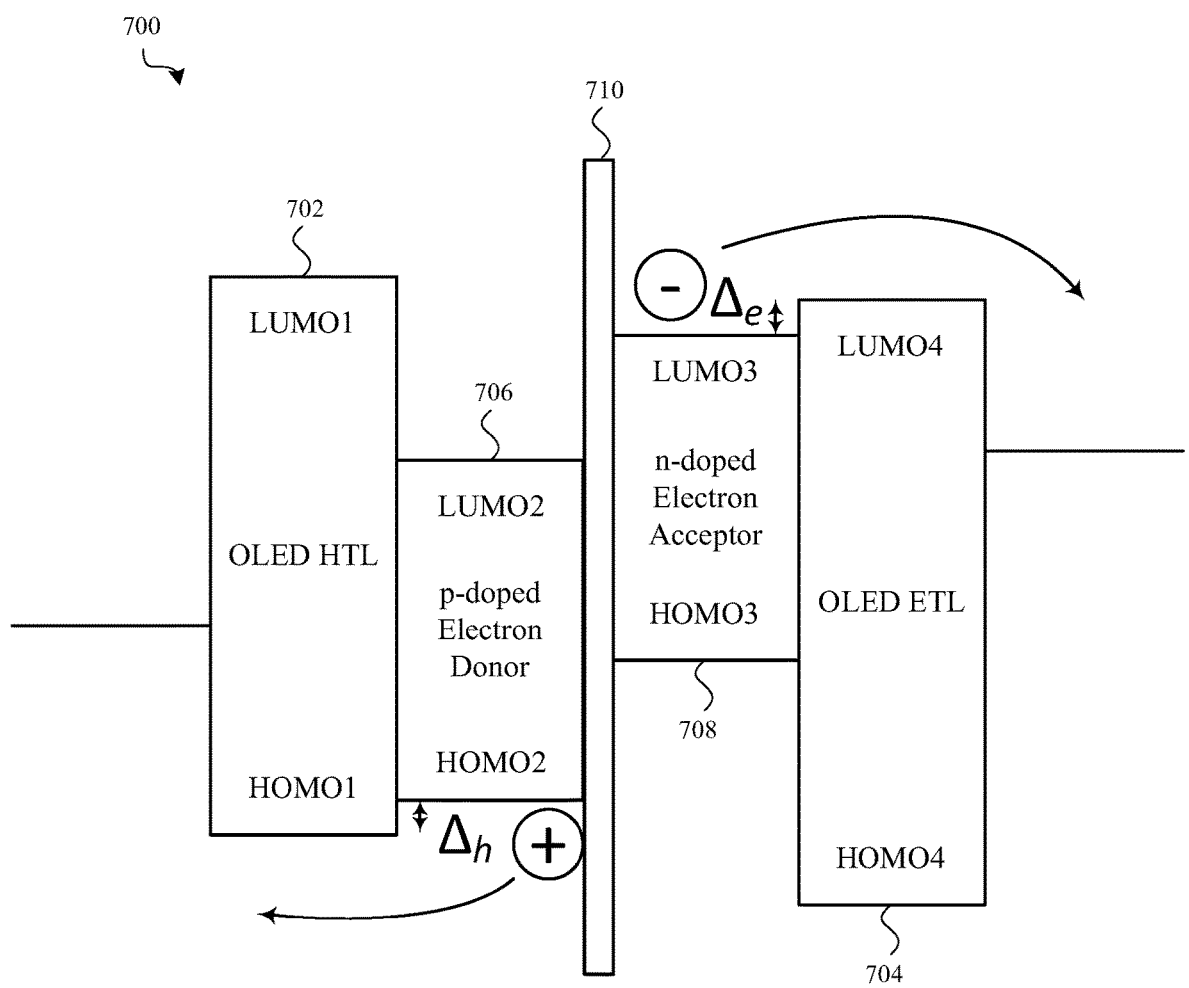
FIG. 7 shows a fourth example embodiment of an OPD pixel.

FIG. 7 shows a fourth example embodiment of an OPD pixel 700. In some cases, the OPD pixel 700 may be included in the display 104 described with reference to FIGS. 1A-1B, or in the array of OPD pixels described with reference to FIG. 2. The OPD pixel 700 may also be the OPD pixel described with reference to FIG. 3.

The OPD pixel 700 differs from the OPD pixel described with reference to FIG. 4 in that the energies of its electron donor material and electron acceptor material are shifted via doping to form a p-n junction.

The OPD pixel 700 includes an OLED HTL 702, an OLED ETL 704, an electron donor material (or electron donor layer) 706, and an electron acceptor material (or electron acceptor layer) 708. The electron donor material 706 and the electron acceptor material 708 may be stacked with the OLED HTL 702 and the OLED ETL 704, with both the electron donor material 706 and the electron acceptor material 708 positioned between the OLED HTL 702 and the OLED ETL 704, and with the electron acceptor material 708 positioned between the electron donor material 706 and the OLED ETL 704. Alternatively, the electron donor material 706 and the electron acceptor material 708 may be mixed together in a random or intentional way to form a bulk heterojunction. The electron donor material 706 may include a p-dopant material (e.g., an organic p-dopant material may be mixed with or injected into a host electron donor material)), and the electron acceptor material 708 may include an n-dopant material (e.g., an organic n-dopant material may be mixed with or injected into a host electron acceptor material).

Examples of the electron donor material 706 include acenes, acene derivatives, or phtalocyanine derivatives. Examples of the electron acceptor material 708 include fullerenes, fullerene derivatives, rylene diimides, or rylene diimide derivatives. Examples of the p-dopant material include tetracyanoquinodimethanes and tetracyanoquinodimethane derivatives. Examples of the n-dopant material include certain alkali metals and certain lanthanides.

The energy shifts and resultant p-n junction provided by doping the electron donor material 706 and the electron acceptor material 708 facilitate charge separation; reduce the hole barrier ($\Delta_h$) between the HOMO energy of the electron donor material 706 (HOMO2) and the HOMO energy of the OLED HTL 702 (HOMO1); and reduce the electron barrier ($\Delta_e$) between the LUMO energy of the electron acceptor material 708 (LUMO3) and the LUMO energy of the OLED ETL 704 (LUMO4).

Figure 8A:
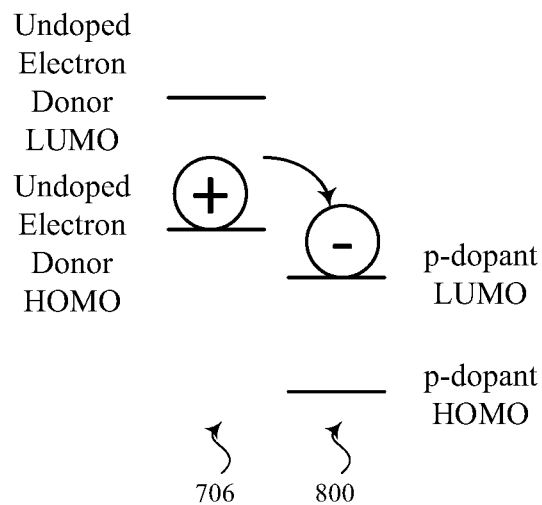
FIGS. 8A and 8B show doping of an electron donor material and an electron acceptor material.
Figure 8B:
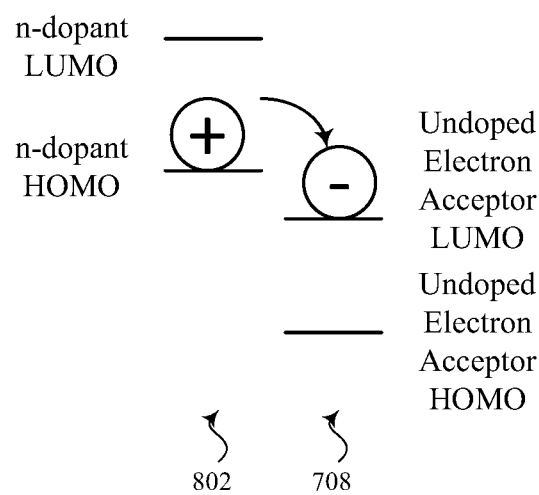

As shown in FIGS. 8A and 8B, each of the electron donor material 706, the electron acceptor material 708, the p-dopant material 800 and the n-dopant material 802 may have a LUMO energy and a HOMO energy. In some embodiments, the p-dopant material 800 may be selected such that the LUMO energy of the p-dopant material 800 is energetically deeper than the HOMO energy of the electron donor material 706, and the n-dopant material 802 may be selected such that the HOMO energy of the n-dopant material 802 is energetically shallower than the LUMO energy of the electron acceptor material 708.

Optionally, an interlayer 710 (FIG. 7) may be positioned between the electron donor material 706 and the electron acceptor material 708 (or alternatively, within a mix of the electron donor material 706 and the electron acceptor material 708). The interlayer 710 may be used to reduce recombination of separated electrons and holes. The interlayer 710 may be relatively thin in comparison to the electron donor material 706 and the electron acceptor material 708.

The oscillator strength of the electron donor material 706 and the electron acceptor material 708 should be high.

Figure 9:
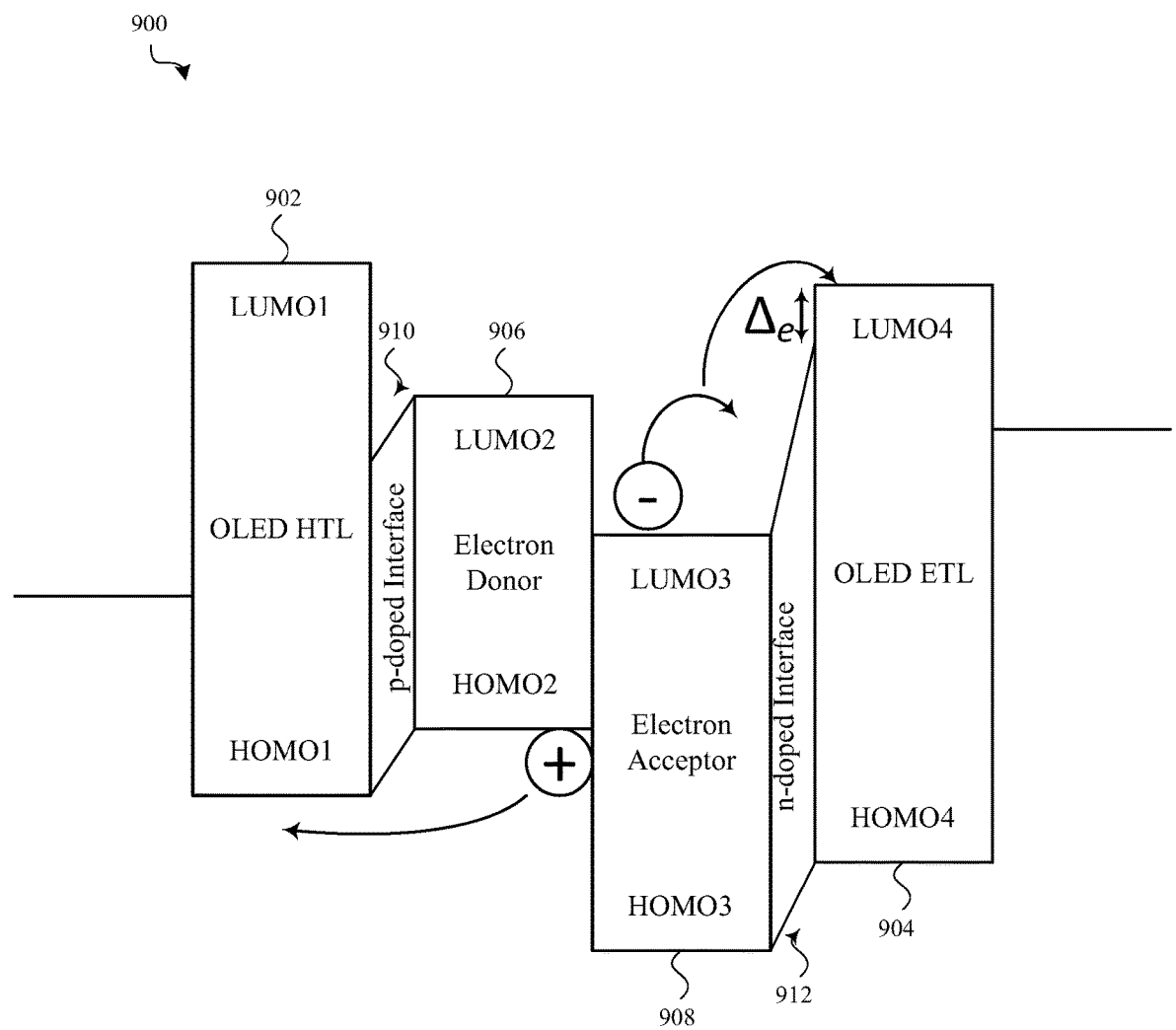
FIG. 9 shows a fifth example embodiment of an OPD pixel.

FIG. 9 shows a fifth example embodiment of an OPD pixel 900. In some cases, the OPD pixel 900 may be included in the display 104 described with reference to FIGS. 1A-1B, or in the array of OPD pixels described with reference to FIG. 2. The OPD pixel 900 may also be the OPD pixel described with reference to FIG. 3.

The OPD pixel 900 differs from the OPD pixel described with reference to FIG. 4 in that the energies of its electron donor layer and electron acceptor layer are bent via one or two doped interfaces 910, 912.

The OPD pixel 900 includes an OLED HTL 902, an OLED ETL 904, an electron donor material (or electron donor layer) 906, an electron acceptor material (or electron acceptor layer) 908, a first interface 910, and a second interface 912. The electron donor material 906 and the electron acceptor material 908 may be stacked with the OLED HTL 902 and the OLED ETL 904, with both the electron donor material 906 and the electron acceptor material 908 positioned between the OLED HTL 902 and the OLED ETL 904, and with the electron acceptor material 908 positioned between the electron donor material 906 and the OLED ETL 904. The first interface 910 may be disposed between the OLED HTL 902 and the electron donor material 906, and the second interface 912 may be disposed between the electron acceptor material 908 and the OLED ETL 904. Alternatively, the electron donor material 906 and the electron acceptor material 908 may be mixed together in a random or intentional way and connected to both the first interface 910 and the second interface 912.

Examples of the electron donor material 706 include acenes, acene derivatives, or phtalocyanine derivatives. Examples of the electron acceptor material 708 include fullerenes, fullerene derivatives, rylene diimides, or rylene diimide derivatives. Examples of the p-dopant material include tetracyanoquinodimethanes and tetracyanoquinodimethane derivatives. Examples of the n-dopant material include certain alkali metals and certain lanthanides.

The first interface 910 may include an organic p-dopant material and bend an energy band of the first interface 910 to facilitate charge extraction (hole extraction) via the OLED HTL 902. The second interface 912 may include an organic n-dopant material and bend an energy band of the second interface 912 to facilitate charge extraction (electron extraction) via the OLED ETL 904.

The band bending provided by the doped first and second interfaces 910, 912 reduces the $\Delta_h$ and $\Delta_e$ energetic barriers described with reference to FIG. 4. For example, the first interface 910 may bend a HOMO energy of the electron donor material 906 (HOMO2) toward the HOMO energy of the OLED HTL 902 (HOMO1). Similarly, the second interface 912 may bend a LUMO energy of the electron acceptor material 908 (LUMO3) toward the LUMO energy of the OLED ETL 904 (LUMO4).

In some embodiments, the OPD pixel 900 may include one or the other, but not both, of the first interface 910 and the second interface 912. For example, the OPD pixel 900 may only include an interface that removes (or reduces) the largest of the energetic barriers (e.g., the OPD pixel 900 may only include the second interface 912, which in the OPD pixel 900 reduces the $\Delta_e$ energetic barrier.

Each of the first and second interfaces 910, 912 may be a host-guest system or a self-doped neat material, with the first and second interfaces 910, 912 having the same or different constructions (e.g., both may be host-guest systems, both may be self-doped neat materials, or one may be a host-guest system and the other may be a self-doped neat material). When provided as host-guest systems, the first interface 910 may include a doped portion of the electron donor material 906, and the second interface 912 may include a doped portion of the electron acceptor material 908. In some cases, the entirety of the electron donor material 906 or electron acceptor material 908 may be doped, with the doping having a uniform or variable concentration. When provided as self-doped neat materials, the first interface 910 may be a first intermediate material (i.e., a material apart from the OLED HTL 902 and the electron donor material 906) including a p-dopant material, and the second interface 912 may be a second intermediate material (i.e., a material apart from the electron acceptor material 908 and the OLED ETL 904) including an n-dopant material.

The various techniques described herein for integrating an OPD pixel into an OLED display are not mutually exclusively and can be combined in a variety of ways. For example, an interface between an OLED HTL and an electron donor material (or between an OLED HTL and a bulk heterojunction) may be doped, and an interface between an OLED ETL and an electron acceptor material (or between an OLED ETL and a bulk heterojunction) may be provided with an energetic staircase, or vice versa. Also, or alternatively, the OLED HTLs described herein may be replaced or supplemented with one or more of an OLED HTL, an OLED HIL, an OLED HBL, or other materials or layers. Similarly, the OLED ETLs described herein may be replaced or supplemented with one or more of an OLED ETL, an OLED EIL, an OLED EBL, or other materials or layers.

Figure 10:
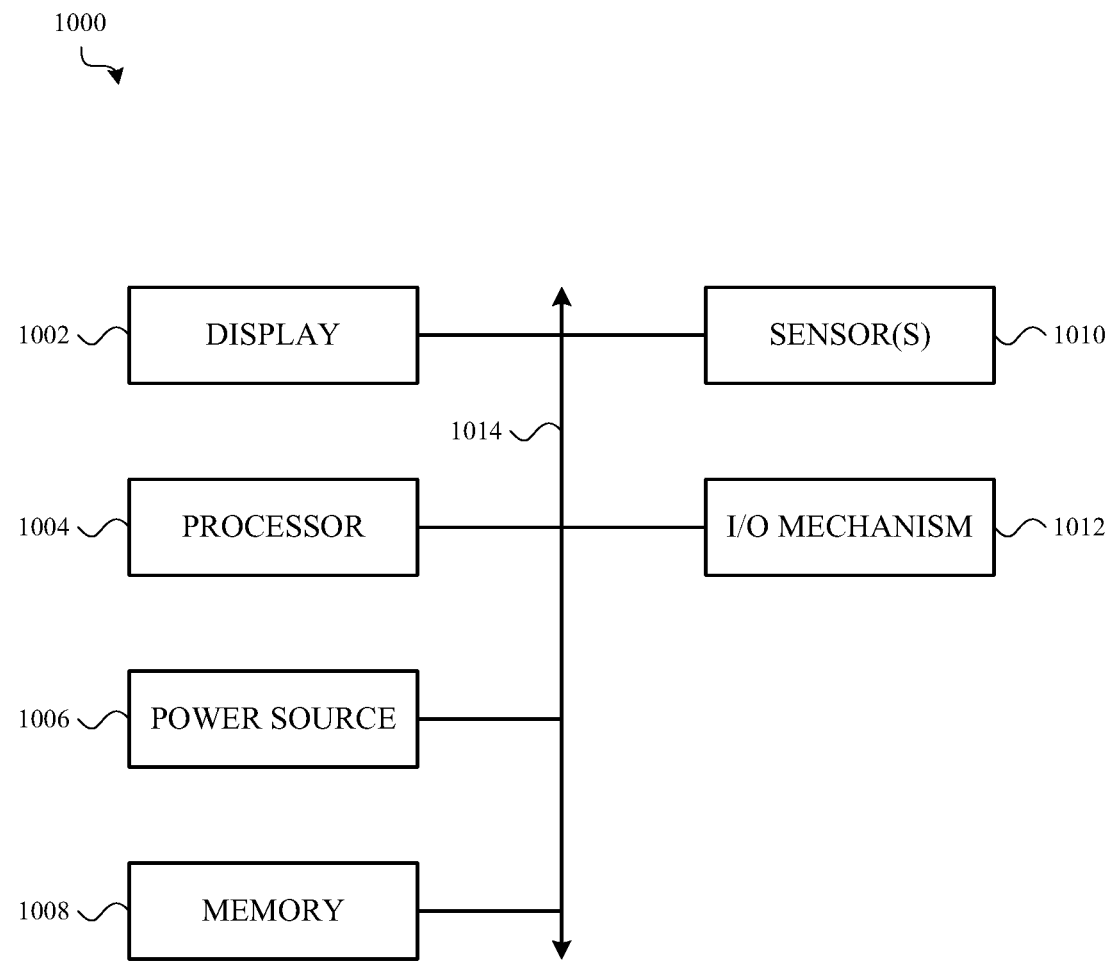
FIG. 10 shows an example electrical block diagram of an electronic device.

FIG. 10 shows a sample electrical block diagram of an electronic device 1000, which electronic device may in some cases take the form of the device described with reference to FIGS. 1A-1B and/or include one or more of the OLED pixels and/or OPD pixels described with reference to any of FIGS. 1A-9. The electronic device 1000 may include a display 1002 (e.g., a light-emitting display), a processor 1004, a power source 1006, a memory 1008 or storage device, a sensor system 1010, or an input/output (I/O) mechanism 1012 (e.g., an input/output device, input/output port, or haptic input/output interface). The processor 1004 may control some or all of the operations of the electronic device 1000. The processor 1004 may communicate, either directly or indirectly, with some or all of the other components of the electronic device 1000. For example, a system bus or other communication mechanism 1014 can provide communication between the display 1002, the processor 1004, the power source 1006, the memory 1008, the sensor system 1010, and the I/O mechanism 1012.

The processor 1004 may be implemented as any electronic device capable of processing, receiving, or transmitting data or instructions, whether such data or instructions is in the form of software or firmware or otherwise encoded. For example, the processor 1004 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements.

It should be noted that the components of the electronic device 1000 can be controlled by multiple processors. For example, select components of the electronic device 1000 (e.g., the sensor system 1010) may be controlled by a first processor and other components of the electronic device 1000 (e.g., the display 1002) may be controlled by a second processor, where the first and second processors may or may not be in communication with each other.

The power source 1006 can be implemented with any device capable of providing energy to the electronic device 1000. For example, the power source 1006 may include one or more batteries or rechargeable batteries. Additionally or alternatively, the power source 1006 may include a power connector or power cord that connects the electronic device 1000 to another power source, such as a wall outlet.

The memory 1008 may store electronic data that can be used by the electronic device 1000. For example, the memory 1008 may store electrical data or content such as, for example, audio and video files, documents and applications, device settings and user preferences, timing signals, control signals, and data structures or databases. The memory 1008 may include any type of memory. By way of example only, the memory 1008 may include random access memory, read-only memory, Flash memory, removable memory, other types of storage elements, or combinations of such memory types.

The electronic device 1000 may also include one or more sensor systems 1010 positioned almost anywhere on the electronic device 1000. The sensor system(s) 1010 may be configured to sense one or more types of parameters, such as but not limited to, light; touch; force; heat; movement; relative motion; biometric data (e.g., biological parameters) of a user; particulate matter concentration, air quality; proximity; position; connectedness; and so on. By way of example, the sensor system(s) 1010 may include a heat sensor, a position sensor, a light or optical sensor, an accelerometer, a pressure transducer, a gyroscope, a magnetometer, a health monitoring sensor, a particulate matter sensor, an air quality sensor, and so on. Additionally, the one or more sensor systems 1010 may utilize any suitable sensing technology, including, but not limited to, magnetic, capacitive, ultrasonic, resistive, optical, acoustic, piezoelectric, or thermal technologies.

The I/O mechanism 1012 may transmit or receive data from a user or another electronic device. The I/O mechanism 1012 may include the display 1002, a touch sensing input surface, a crown, one or more buttons (e.g., a graphical user interface "home" button), one or more cameras (including an under-display camera and/or one or more OPD pixels, as described with reference to FIGS. 1A-9), one or more microphones or speakers, one or more ports such as a microphone port, and/or a keyboard. Additionally or alternatively, the I/O mechanism 1012 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

As described above, one aspect of the present technology may be the gathering and use of data available from various sources, including biometric data (e.g., face, fingerprint, or retina data). The present disclosure contemplates that, in some instances, this gathered data may include personal information data that uniquely identifies or can be used to identify, locate, or contact a specific person. Such personal information data can include, for example, biometric data (e.g., fingerprint data) and data linked thereto (e.g., demographic data, location-based data, telephone numbers, email addresses, home addresses, data or records relating to a user's health or level of fitness (e.g., vital signs measurements, medication information, exercise information), date of birth, or any other identifying or personal information).

The present disclosure recognizes that the use of such personal information data, in the present technology, can be used to the benefit of users. For example, the personal information data can be used to authenticate a user to access their device, or gather performance metrics for the user's interaction with an augmented or virtual world. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide data to targeted content delivery services. In yet another example, users can select to limit the length of time data is maintained or entirely prohibit the development of a baseline profile for the user. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

What is claimed is:

1. An organic light-emitting diode (OLED) display, comprising:
    an array of OLED pixels, wherein an OLED pixel in the array of OLED pixels includes,
        an OLED hole transport layer (HTL);
        an OLED electron transport layer (ETL); and
        an emissive layer positioned between the OLED HTL and the OLED ETL; and
    an array of organic photodetector (OPD) pixels, wherein an OPD pixel in the array of OPD pixels includes,
        the OLED HTL;
        the OLED ETL; and
        an electron donor material positioned between the OLED HTL and the OLED ETL, wherein the OLED ETL functions as an electron acceptor material for the OPD pixel.

2. The OLED display of claim 1, wherein the array of OPD pixels is interspersed with the array of OLED pixels.

3. The OLED display of claim 1, wherein a first lowest unoccupied molecular orbital (LUMO) energy of the electron donor material is energetically shallower than a second LUMO energy of the OLED ETL.

4. The OLED display of claim 3, wherein the first LUMO energy of the electron donor material is energetically shallower than a third LUMO energy of the OLED HTL.

5. The OLED display of claim 3, wherein a first highest occupied molecular orbital (HOMO) energy of the electron donor material is energetically shallower than and approximately equal to a second HOMO energy of the OLED HTL.

6. The OLED display of claim 3, wherein a first highest occupied molecular orbital (HOMO) energy of the electron donor material is energetically shallower than a second HOMO energy of the OLED ETL.

7. The OLED display of claim 1, wherein an oscillator strength of the electron donor material is greater than 0.1.

8. A display, comprising:
    an organic light-emitting diode (OLED) pixel, including,
        an OLED hole transport layer (HTL); and
        an OLED electron transport layer (ETL); and
    an organic photodetector (OPD) pixel, including,
        the OLED HTL;
        the OLED ETL;
        an electron donor material positioned between the OLED HTL and the OLED ETL;
        an electron acceptor material positioned between the OLED HTL and the OLED ETL; and
        an intermediate material; wherein,
        the electron acceptor material and the electron donor material are positioned on a first side of the intermediate material, and the OLED ETL is positioned on a second side of the intermediate material.

9. The display of claim 8, wherein:
    a first lowest unoccupied molecular orbital (LUMO) energy of the intermediate material is energetically deeper than a second LUMO energy of the electron acceptor material; and the first LUMO energy of the intermediate material is energetically shallower than a third LUMO energy of the OLED ETL.

10. The display of claim 8, wherein:
the intermediate material is a first intermediate material; and
the display further comprises at least a second intermediate material; and
the second intermediate material is positioned between the first intermediate material and the OLED ETL.

11. The display of claim 10, wherein the second intermediate material includes a different material than the first intermediate material.

12. The display of claim 8, wherein an oscillator strength of the intermediate material is lower than 0.1.

13. The display of claim 8, wherein the electron donor material and the electron acceptor material are stacked.

14. The display of claim 8, wherein the electron donor material and the electron acceptor material are mixed to form a bulk heterojunction.

15. An organic photodetector (OPD) pixel, comprising:
an organic light-emitting diode (OLED) hole transport layer (HTL); and
an OLED electron transport layer (ETL);
an electron donor material positioned between the OLED HTL and the OLED ETL and including a p-dopant material;
an electron acceptor material positioned between the OLED HTL and the OLED ETL and including an n-dopant material; and
an interlayer positioned between or within the electron donor material and the electron acceptor material; wherein,
the electron donor material including the p-dopant material and the electron acceptor material including the n-dopant material form a p-n junction.

16. The OPD pixel of claim 15, wherein:
a first lowest unoccupied molecular orbital (LUMO) energy of the p-dopant material is energetically deeper than a first highest occupied molecular orbital (HOMO) energy of the electron donor material; and
a second HOMO energy of the n-dopant material is energetically shallower than a second LUMO energy of the electron acceptor material.

17. An organic photodetector (OPD) pixel, comprising:
an organic light-emitting diode (OLED) hole transport layer (HTL);
an OLED electron transport layer (ETL);
an electron donor material positioned between the OLED HTL and the OLED ETL;
an electron acceptor material positioned between the OLED HTL and the OLED ETL; and
a first interface layer between the electron acceptor material and the OLED ETL, the first interface layer including an organic n-dopant material.

18. The OPD pixel of claim 17, further comprising:
a second interface layer between the OLED HTL and the electron donor material, the second interface layer including an organic p-dopant material.

19. The OPD pixel of claim 17, wherein the first interface layer comprises:
an intermediate material doped with the organic n-dopant material; wherein,
the intermediate material is positioned between the electron acceptor material and the OLED ETL.

20. The OPD pixel of claim 17, wherein the electron donor material and the electron acceptor material are mixed to form a bulk heterojunction.

21. The OPD pixel of claim 17, wherein the electron acceptor material comprises a dopant material having a uniform concentration.

22. An organic photodetector (OPD) pixel, comprising:
an organic light-emitting diode (OLED) hole transport layer (HTL); and
an OLED electron transport layer (ETL);
an electron donor material positioned between the OLED HTL and the OLED ETL and including a p-dopant material; and
an electron acceptor material positioned between the OLED HTL and the OLED ETL and including an n-dopant material; wherein,
the electron donor material including the p-dopant material and the electron acceptor material including the n-dopant material form a p-n junction;
a first oscillator strength of the electron donor material is greater than 0.1; and
a second oscillator strength of the electron acceptor material is lower than 0.1.

23. The OPD pixel of claim 22, wherein the electron donor material and the electron acceptor material are mixed to form a bulk heterojunction.

24. The OPD pixel of claim 22, further comprising:
an interlayer positioned between or within the electron donor material and the electron acceptor material.

* * * * *